United States Patent [19]

Kuo et al.

[11] Patent Number: 5,446,814
[45] Date of Patent: Aug. 29, 1995

[54] MOLDED REFLECTIVE OPTICAL WAVEGUIDE

[75] Inventors: Shun-Meen Kuo, Chandler; Christopher K. Y. Chun, Gilbert, both of Ariz.

[73] Assignee: Motorola, Schaumburg, Ill.

[21] Appl. No.: 355,457

[22] Filed: Dec. 13, 1994

Related U.S. Application Data

[63] Continuation-in-part of Ser. No. 147,514, Nov. 5, 1993.

[51] Int. Cl.⁶ ............................................. G02B 6/28
[52] U.S. Cl. ................................... 385/31; 385/89; 385/88; 385/49
[58] Field of Search ............... 385/31, 14, 88, 89, 385/129, 130, 131, 132, 143, 145, 146, 47, 1; 250/227.14, 227.15, 227.22; 341/31; 264/1.1, 1.7; 257/433, 458, 698, 724

[56] References Cited

U.S. PATENT DOCUMENTS

| | | | |
|---|---|---|---|
| 4,285,571 | 8/1981 | Winzer | 385/47 X |
| 4,373,775 | 2/1983 | Gasparian | 385/47 |
| 4,423,922 | 1/1984 | Porter | 385/47 X |
| 4,621,895 | 11/1986 | Motsko | 385/47 |
| 5,170,448 | 12/1992 | Ackley et al. | 385/47 X |
| 5,249,245 | 9/1993 | Lebby et al. | 385/132 X |
| 5,265,184 | 11/1993 | Lebby et al. | 385/132 |
| 5,271,083 | 12/1993 | Lebby et al. | 385/14 X |

FOREIGN PATENT DOCUMENTS 4333004  11/1992  Japan ................. 385/14

Primary Examiner—Frank Gonzalez
Assistant Examiner—Phan T. H. Palmer
Attorney, Agent, or Firm—Gary F. Witting

[57] ABSTRACT

A molded reflective optical waveguide module is provided. A molded first optical portion having a fist surface or a major surface is formed. A core region having a first end and a second end is disposed into the first surface of the molded first optical portion with the first end of the core region terminating in a surface having an angle. A second molded optical portion having electrical traces and photonic devices can be applied to the molded first optical portion.

15 Claims, 2 Drawing Sheets

MOLDED REFLECTIVE OPTICAL WAVEGUIDE

This application is a continuation of prior application Ser. No. 08/147,514, filed Nov. 5, 1993.

BACKGROUND OF THE INVENTION

This invention relates, generally, to optics, and more particularly, to coupling of optical devices, as well as coupling of an optical device to an optical fiber.

At present, coupling of optical signals or light signals to optical elements, such as photonic devices, optical fibers, and waveguides sometimes requires changing the direction of the optical signals and directing the optical signals toward the optical elements. Presently, in the case of a waveguide, the waveguide is cut or cleaved at an angle that is precise so as to provide a surface. The surface typically is either coated with a reflective material or a reflective optical element such as a mirror is attached to the surface. However, waveguides are not easily cleaved or cut at precise angles, thus the precise angle is generally compromised. With the angle being compromised, the reflective material or the mirror that is applied or attached to the surface is not capable of reflecting the light signals in an optimum direction, thus not allowing optimal coupling from the surface to the optical element or elements.

Further, in an attempt to increase precision, alignment and optimization of coupling between the light signals and other optical elements is typically achieved by hand. The use of hand methods or semiautomatic methods to align and to optimize light signals directed to other optical elements increases cost and does not allow for mass production of this type of coupling between light signals and optical elements.

Additionally, coupling of photonic devices and optical fibers requires reflecting the optical signals from the photonic device to the optical fiber. Generally, this coupling is achieved as previously described herein above, but further is complicated by not only the alignment and optimization of the reflective surface but also the alignment and optimization of the optical fiber to the waveguide. As previously described, both of these alignments and optimizations are achieved by hand, thus making the cost of manufacturing extremely high, as well as not allowing the coupling of these optical elements to be achieved in high volume manufacturing environments.

By now it should be apparent, that the presently used coupling methods for connecting light signals to a variety of optical elements have severe problems that severely limit their use in a production environment. Further it should be pointed out that alignment of optical fibers and reflective materials or surfaces with waveguides typically is achieved by aligning the fibers and or mirrors by hand, thus incurring a high cost in manufacturing. Thus, a method for connecting or coupling optical elements with waveguides that is cost effective and manufacturable in a high volume manufacturing environment would be highly desirable.

SUMMARY OF THE INVENTION

Briefly stated, a molded reflective optical waveguide module is provided. A molded first optical portion having a major surface is formed. A core region having a first end and a second end is disposed into the major surface of the molded first optical portion with the first end of the core region terminating in a surface having an angle.

DETAILED DESCRIPTION OF THE DRAWINGS

Figure 1:
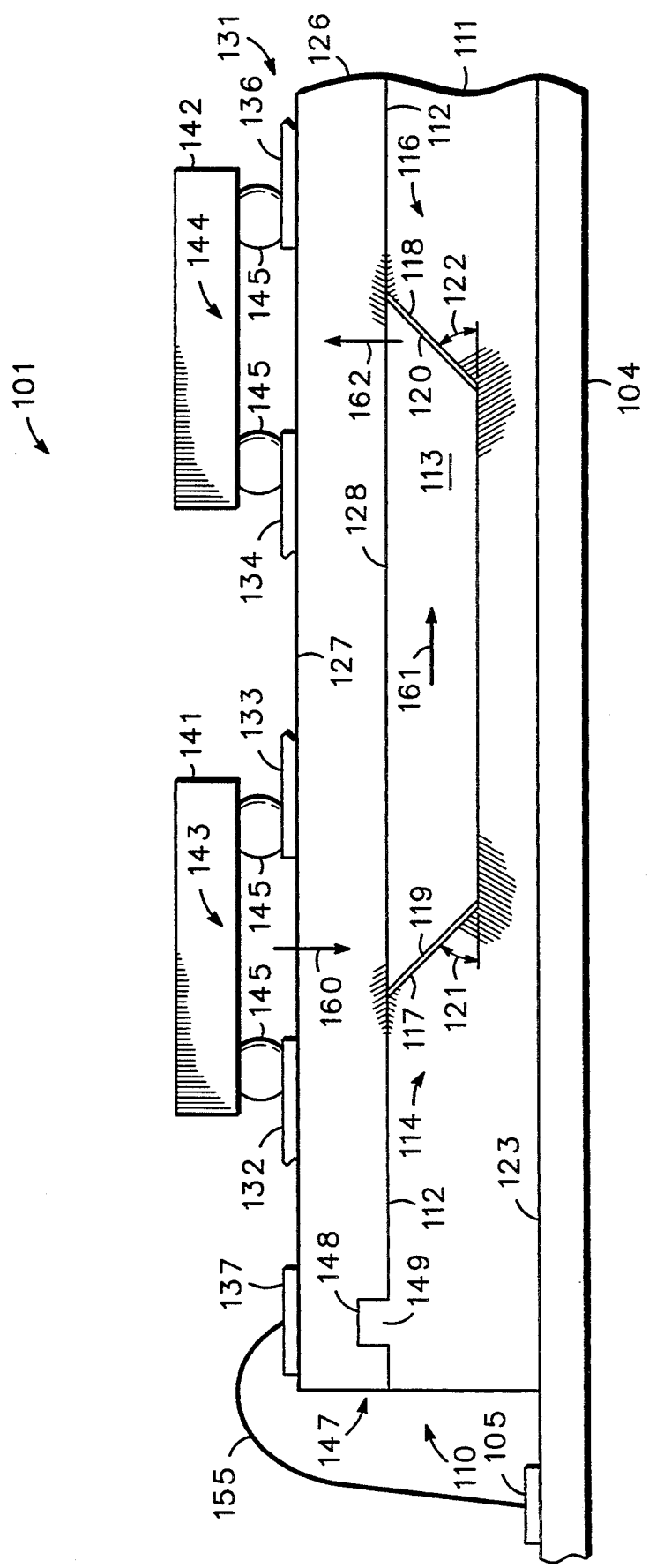
FIG. 1 is a simplified highly enlarged sectional view of a reflective optical waveguide module.

FIG. 1 is an illustration of a simplified highly enlarged sectional view of a reflective waveguide module 101 embodying the present invention. Reflective waveguide module 101 includes several features or elements, such as a substrate 104 having a plurality of electrical traces indicated by bonding pad 105, a waveguide 110 having a first optical portion 111 with a core region 113 and a second optical portion 126 having a plurality of electrical traces 131 indicated by electrical traces 132, 133, 134, 136, and bonding pad 137 disposed thereon, and photonic devices 141 and 142 with working portions 143 and 144, respectively. It should be understood that FIG. 1 illustrates only a small portion of reflective waveguide module 101, thus FIG. 1 does not represent any particular size or dimensionality of reflective waveguide module 101. It should be further understood that reflective waveguide module 101 is capable of extending into and out of the figure. Further, it should be understood that FIG. 1 has been greatly simplified in order to better illustrate the present invention, thus specific engineering details have purposefully omitted.

Referring now to FIG. 1, substrate 104 is made of any suitable substrate, such as a ceramic interconnect substrate, an FR4, a printed circuit board (PCB), or the like. However, it should be understood that selection of a specific type of substrate used for substrate 104 is application specific and determines the complexity of routing of electrical signals through substrate 104. As shown in FIG. 1, substrate 104 is an interconnect substrate having a plurality of electrical traces, illustrated by bonding pad 105.

Generally, reflective waveguide module 110 includes first optical portion 111 and second optical portion 126 that are mated with an optical adhesive, such as an epoxy, a polyimide, a polymer, or the like. Optical portions 111 and 126 are made by any suitable method, such as precision milling, molding or the like. However, in a preferred embodiment of the present invention, first and second optical portions 111 and 126 are made by molding in accordance with the teachings of U.S. patent bearing Ser. No. 07/889,335, entitled "MOLDED WAVEGUIDE AND METHOD OF MAKING SAME", filed on May 28, 1992 now U.S. Pat. No. 5,265,184 and assigned to same assignee which is hereby incorporated by reference. In order to simplify the description of the present invention, the disclosure will describe the making of first and second optical portions 111 and 126 in terms of molding.

More specifically, optical portions 111 and 126 are molded with surfaces 112 and 127 and surfaces 123 and 128, respectively. Surface 112 of optical portion 111 is molded having a channel or a groove (shown as core region 113) being disposed therein. The groove or channel is molded with terminal ends 114 and 116. It should be understood that while only a single groove (i.e. core region 113) is shown in FIG. 1, a plurality of grooves (i.e. a plurality of core regions) typically are molded into surface 112 of optical portion 111. Terminal ends 114 and 116 are made having surfaces 117 and 118 that are set at angles 121 and 122, respectively. Determination of angles 121 and 122 are application specific; however, angles 121 and 122 range from 10 degrees to 80 degrees, with a preferable range from 40 degrees to 50 degrees with a preferred angle of 45 degrees.

Additionally, surfaces 117 and 118 are capable of having layers 119 and 120, respectively, being applied or deposited on surfaces 117 and 118, thereby generating a more reflective surface. Generally, layers 119 and 120 are made of any suitable reflective material, such as gold, silver, aluminum, platinum, titungsten, or the like, thereby providing an optimum reflective surface. Typically, application of layers 119 and 120 of reflective material on surfaces 117 and 118 is achieved by any suitable method well-known in the art, such as deposition, evaporation, sputtering, or the like.

An alignment guide system 147 including portions 148 and 149 of optical portions 111 and 126, respectively, are made so as to provide accurate alignment and precise placement of first and second optical portions 111 and 126 together. Alignment guide system 147 is made by any suitable method, such as precision milling, molding, laser ablating, or the like. However, in a preferred embodiment of the present invention, alignment guide system 147 is molded simultaneously with optical portions 111 and 126, thereby ensuring proper and precise cooperation or interaction between portions 148 and 149. Additionally, portions 148 and 149 are made in any suitable form or configuration, such as tabs, keys, or the like. For example, as shown in FIG. 1, portion 149 is formed or shaped as an elevated tab and portion 148 is formed or shaped as an opening or a groove, thus enabling the opening to fit over the tab and aligning first optical portion 111 with second optical portion 126.

Joining or mating of optical portion 111 and optical portion 126 is achieved by adhering optical portion 111 to optical portion 126 by any suitable optical adhesive, such as epoxies, polyimides, plastics, polymers, or the like. Generally, a suitable amount of the optical adhesive is applied to surface 112 of optical portion 111. Surface 128 of optical portion 126 is subsequently applied to surface 112 of optical portion 111, thereby filling the grooves molded in surface 112 of optical portion 111, as well as squeezing an excess of optical adhesive between optical portions 111 and 126. The filled groove or grooves subsequently become core region 113 as shown in FIG. 1 or core regions.

The plurality of electrical traces 131 including electrical traces 132, 133, 134, 136, and bonding pad 137 are disposed on surface 127 of optical portion 126, thereby providing routing of electrical signals throughout the plurality of electrical traces 131. Also, it should be understood that providing bonding pad 137 enables an electrical connection or electrical coupling between the plurality of electrical traces 131 on surface 127 to bonding pad 105 that is electrically coupled to the plurality of electrical traces on substrate 104 through wire bond 155.

Generally, the plurality of electrical traces 131 are made by well-known methods in the art. Briefly and by way of example, a metal layer or metal alloy layer is deposited on surface 127 of second optical portion 126. A masking material such as photoresist is applied on the metal layer and subsequently exposed and developed, thereby generating a pattern in the photoresist. The patterned photoresist and the metal layer are etched, thereby transferring the pattern from the photoresist into the metal layer. Finally, the etched metal layer on surface 127 is cleaned so as to remove remaining portions of the photoresist layer and leaving the plurality of electrical traces 131 on surface 127.

In general, photonic devices 141 and 142 having working portions 143 and 144, respectively, are mounted on and electrically coupled to the plurality of electrical traces on surface 127. Photonic devices 141 and 142 are capable of being either phototransmitters or photoreceivers; however, generally, if photonic device 141 is a phototransmitter, then photonic device 142 is a photoreceiver. More specifically, if either photonic devices are phototransmitters, any suitable phototransmitter, such as a laser (e.g. vertical cavity surface emitting laser (VCSEL)), light emitting diode, or the like is used. If either photonic devices 141 or 142 are photoreceivers, any suitable photoreceiver, such as a P-I-N photodiode, photodiode, or the like is used. However in a preferred embodiment of the present invention, when phototransmitting devices and photoreceiving devices are required, the phototransmitting devices are VCSEL's and the photoreceiving devices are P-I-N photodiodes.

Generally, photonic devices 141 and 142 are mounted and operably coupled to the plurality of electrical traces 131 on surface 127 by any suitable method, such as tab bonding, conductive bumps, soldering, or the like. However, in a preferred embodiment of the present invention, photonic devices 141 and 142 are mounted and operably coupled to the plurality of the electrical traces by conductive bumps 145. Further, photonic devices 141 and 142 are positioned and aligned to the plurality of electrical traces 131 on surface 128 of optical portion 126 by any suitable method, such as a semi-automatic method, an automatic method, or the like. However, in a preferred embodiment of the present invention, photonic devices 141 and 142 are aligned and mounted to the plurality of electrical traces 131 by using an automatic method, such as a robot, a robotic arm, or the like. Use of an automatic system, especially an automatic system utilizing machine vision, ensures proper placement and mounting of photonic devices 141 and 142 on the plurality of electrical traces 131, thus ensuring proper alignment of working portions 143 and 144 of photonic devices 141 and 142, respectively, to surfaces 117 and 118 of first optical portion 111.

In function and by way of example, with photonic device 141 being a phototransmitter, and with photonic device 142 being a photoreceiver, light signals 160 are emitted from working portion 143 of photonic device 141. Light signals 160 pass through surfaces 127 and 128 of optical portion 126 and strike layer 119 on surface 117 of optical portion 111. Upon striking layer 119 on surface 117 of optical portion 111, light signals 160 are reflected off of layer 119 on surface 117 into core region 113 illustrated by arrow 161. Light signals 161 travel through core region 113 and strike layer 120 on surface 118 and are reflected toward working portion 144 of photonic device 142 as indicated by arrows 162. Light signals 162 enter working portion 144 of photonic device 142 and are converted to electrical signals that are coupled to the plurality of electrical traces 131. The electrical signals are now capable of being outputted or communicated through bonding pad 137 to bonding pad 105 on substrate 104 through wire bond 155. Alternatively, it should be understood that with appropriate configuration of photonic devices 141 and 142, light signals are capable of going in an opposite direction than that indicated in FIG. 1.

Figure 2:
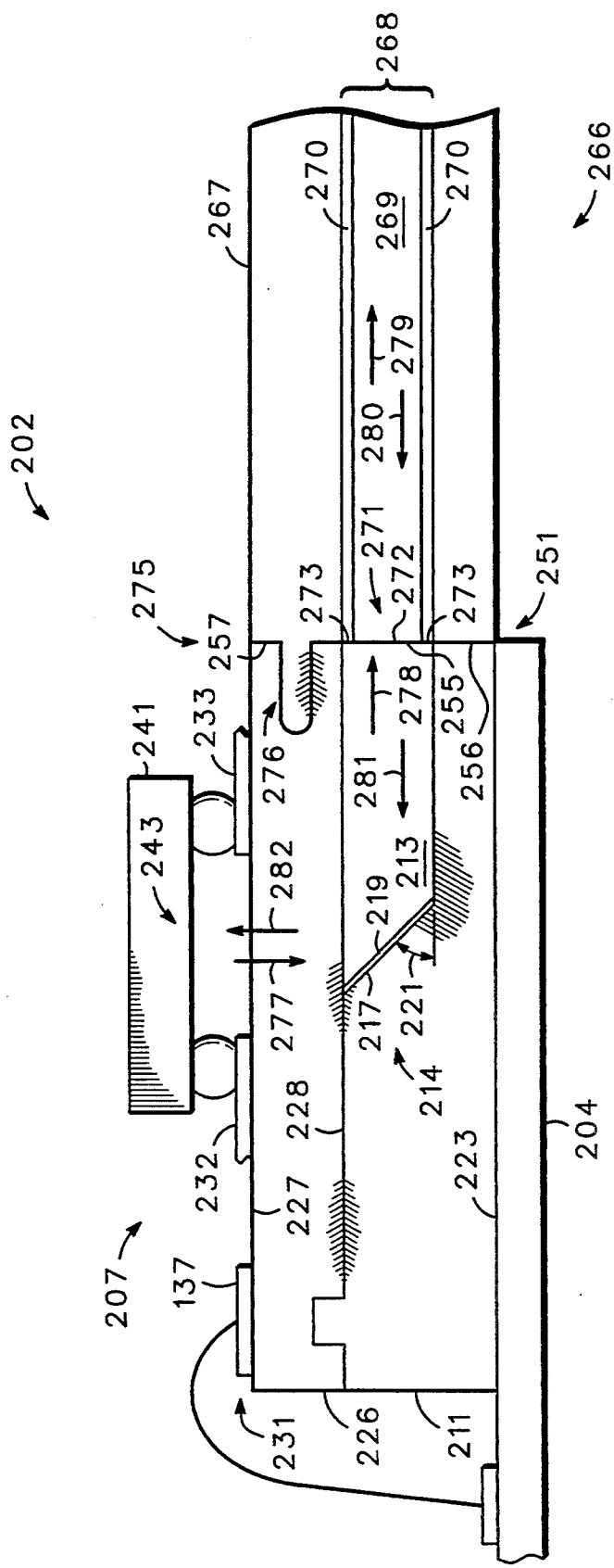
FIG. 2 is a simplified highly enlarged sectional view of a reflective optical interface system.

FIG. 2 is a highly enlarged simplified sectional view of a reflective optical interface system 202 that includes optical interconnect module 207 and optical connector 266. Elements and features that are similar to those described in FIG. 1 will retain their original identifying numerals except that they will begin with a 2 that will replace the 1. Reflective optical interface system 202 includes two main elements, optical interconnect module 207 and optical connector 266. Optical interconnect module 207 includes several similar features as previously described in FIG. 1, such as a substrate 204, an optical portion 211 having a core region 213, a terminal end 214, an optical portion 226 with surfaces 227 and 228, a plurality of electrical traces 231 disposed thereon, and a photonic device 241 with a working portion 243. However, optical interconnect module 207 has several new features as well, such as an end surface 251 that exposes a surface 255 of core region 213, as well as surfaces 256 and 257 of optical portions 211 and 226, respectively.

Optical connector 266 includes several main features or elements, such as a body 267, an optical fiber 268 having a core region 269 and a cladding region 270, and an end surface 271 that exposes surfaces 271 and 273 of core region 269 and cladding region 270, respectively.

Optical interconnect module 207 generally is made similarly to reflective waveguide module 101 as previously described in FIG. 1. However, optical interconnect module 207 is molded so as to expose endsurface 251, thereby exposing surfaces 255 and 257. As shown in FIG. 2, surface 255 exposes a portion of core region 213, thereby providing an optical interconnect surface. Further, surface 257 of end surface 251 is configure to be part of an alignment guide system 275. More specifically, surface 257 of optical portion 226 is formed or molded with an opening 276 that is used for guiding optical connector 266 into place.

Optical connector 266 is made with optical fiber 268 positioned in body 267. During manufacturing of optical connector 266, optical fiber 268 is cut or cleaved to provide surfaces 272 and 273 that expose a cross-sectional surface of optical fiber 268, thereby providing an optical interconnect surface. Exposed surfaces 272 and 273 are positioned and subsequently formed within body 267 of optical connector 266 such that the surfaces 272 and 273 are directed in an outward position, thus enabling optical coupling of optical fiber 268 of optical connector 266 to core region 213 of optical interface module 207.

In function, with photonic device 241 being a phototransmitter, light is emitted from working portion 243, indicated by arrow 277. Light 277 passes through surfaces 227 and 228 of optical portion 226 and strikes layer 219 on surface 216 which reflects light 277 into core region 213, indicated by arrow 278. Light 278 travels through core region 213 and passes through surface 255 of end surface 251 into core region 269 of optical fiber 268, indicated by arrow 279.

Alternatively, with photonic device 241 being a photoreceiver, light, indicated by arrow 280, traveling through core region 269 of optical fiber 268 passes through surfaces 272 and 255, thereby entering core region 213 of optical interconnect module 207, indicated by arrow 281. Light 281 in core region 213 travels through core region 213 and strikes layer 219 on surface 217. Light 281 that strikes surface 219 is reflected toward working portion 243 of photonic device 241 as indicated by arrow 282.

By now it should be appreciated that a novel method for making a reflective waveguide module and a reflective optical interface system have been described. The reflective optical interface system and the reflective waveguide module allows for quick and efficient transfer of light signals between photonic devices and optical fibers in a cost effective manner. Thus, allowing their usage in optical electronic modules with standard electronic components. Additionally, molding of reflective optical interconnect modules and reflective waveguides allows for an inexpensive process for combining both standard electronic components and optical components.

We claim:

1. A molded reflective optical waveguide module comprising:
    a molded first optical portion having a first surface; and
    a core region having a first terminal end and a second terminal end disposed into the first surface of the molded first optical portion, the first terminal end of the core region terminates with a reflective surface that extends across the core region entirety and having an angle, thereby reflecting a light signal.

2. A molded reflective optical waveguide as claimed in claim 1 wherein the reflective surface is coated with a reflective material.

3. A molded reflective optical waveguide as claimed in claim 2 wherein the reflective material is selected from one of the following materials: aluminum, gold, silver, platinum, or titanium.

4. A molded reflective optical waveguide as claimed in claim 1 wherein the core region is positioned at an end surface of the first optical portion so as to expose a cross-section of the core region on the end surface of the molded first optical portion.

5. A molded reflective optical waveguide as claimed in claim 1 wherein the second terminal end of the core region terminates with a reflective surface having an angle.

6. A molded reflective optical waveguide as claimed in claim 1 further comprising a first alignment guide located on the first surface of the molded first optical portion.

7. A molded reflective optical waveguide as claimed in claim 6 further comprising a second molded optical portion having a first surface with a plurality of electrical traces and a second surface having a second alignment guide, the second surface of the second optical portion is mated and aligned with the first surface of the molded first optical portion, wherein the first alignment guide and the second alignment guide are cooperatively joined.

8. A molded optical interconnect module comprising:
    a first molded optical portion having a first surface with a first alignment guide disposed thereon and an end surface;
    a core region having a first terminal end disposed into the first surface of the molded first optical portion, the first terminal end of the core region terminates in a reflective surface that extends across the core region entirety at an angle located in the first surface of the first molded optical portion; and
    a second molded optical portion having a first surface with a first alignment guide and a second surface with a plurality of electrical traces, the first surface and the second surface of the first and the second molded optical portions are mated and aligned using the first alignment guide of the first molded optical portion and the first alignment guide of the second molded optical portion, thereby aligning the first molded optical portion with the second molded optical portion.

9. A molded optical interconnect module as claimed in claim 8 further comprising a photonic device electrically connected to the plurality of electrical traces.

10. A molded optical interconnect module as claimed in claim 9 wherein the photonic device is a light emitting device.

11. A molded optical interconnect module as claimed in claim 10 where the light emitting device is selected from the following group: a light emitting diode, a laser.

12. A molded optical interconnect module as claimed in claim 9 wherein the photonic device is a light receiving device.

13. A molded optical interconnect module comprising:
a molded optical portion having a core region with a terminal end, a cladding region that surrounds the terminal end of the core region and forms a surface, and an end surface having an alignment guide and having a portion of the core region exposed, the terminal end of the core region terminates in a reflective surface that extends across the core region entirety for reflection of a light signal;
a plurality of electrical traces disposed on the surface of the cladding region; and
a photonic device operably coupled to one of the plurality of electrical traces on the surface of the cladding region.

14. A method for making a molded reflective optical waveguide module comprising:
molding a first optical portion having a first surface; and
forming core region having a first terminal end and a second terminal end disposed into the first surface of the molded first optical portion, the first terminal end of the core region terminates with a reflective surface that extends across the core region entirety and having an angle, thereby reflecting a light signal.

15. A method for making a molded reflective opitcal waveguide module as claimed in claim 14 where, in the step of forming core region having a first terminal end and a second terminal end disposed into the first surface of the molded first optical portion, the first terminal end of the core region terminates with a reflective surface, the reflective surface is made by appling a reflective material.

* * * * *